United States Patent
Sun et al.

(10) Patent No.: US 8,829,659 B2
(45) Date of Patent: Sep. 9, 2014

(54) INTEGRATED CIRCUIT

(75) Inventors: Xiaobing Sun, Singapore Science Park II (SG); Yaqiong Zhang, Singapore Science Park II (SG); Yugang Ma, Singapore Science Park II (SG)

(73) Assignee: Sony Corporation, Tokyo (JP)

( * ) Notice: Subject to any disclaimer, the term of this patent is extended or adjusted under 35 U.S.C. 154(b) by 1036 days.

(21) Appl. No.: 12/850,201

(22) Filed: Aug. 4, 2010

(65) Prior Publication Data

US 2011/0037178 A1  Feb. 17, 2011

(30) Foreign Application Priority Data

Aug. 12, 2009 (SG) ................. 200905424-8

(51) Int. Cl.
*H01L 29/93* (2006.01)

(52) U.S. Cl.
USPC ........... 257/662; 257/661; 257/663; 257/664; 257/665; 257/259; 257/E23.141

(58) Field of Classification Search
USPC ............................ 257/773, 661–665, E23.141
See application file for complete search history.

(56) References Cited

U.S. PATENT DOCUMENTS

| 3,573,670 | A | 4/1971 | Skobern |
| 2001/0038146 | A1* | 11/2001 | Shimizu .................. 257/728 |
| 2008/0136552 | A1 | 6/2008 | Kim et al. |

FOREIGN PATENT DOCUMENTS

EP  0 803 907 A2  10/1997

OTHER PUBLICATIONS

Sharma et al.; Characteristic Impedance of a Microstrip-Like Interconnect Line in Presence of Ground Plane Aperture; International Journal of Microwave Science and Technology; 2007.
Kwon et al.; Co-planar Waveguide Filter with Ground Perforation for Ultra-wide System; APMC 2005 Proceedings.
Lim et al.; Characterization and Modeling of Various Wire Bond Transistions; IEEE Transactions on Advanced Packaging; vol. 28, No. 4; Nov. 2005.
Examination Report dated Oct. 24, 2011 in connection with counterpart Singapore Application No. SG 200905424-8.

* cited by examiner

*Primary Examiner* — Elias M Ullah
(74) *Attorney, Agent, or Firm* — Dentons US LLP

(57) ABSTRACT

An integrated circuit connection comprises a substrate, first and second transmission lines, a die, and a conductive ribbon. The first transmission line has a first end and is arranged on the substrate. The die is spaced from the first end. The die has a first surface, which is arranged on the substrate, and a second surface, which is opposite to the first surface and which has the second transmission line arranged thereon. The second transmission line has a second end. The conductive ribbon electrically couples the first and the second ends.

13 Claims, 5 Drawing Sheets

INTEGRATED CIRCUIT

CROSS REFERENCE TO RELATED APPLICATIONS

The present application claims priority to Singapore Patent Application JP 200905424-8 filed in the Singapore Patent Office on Aug. 12, 2009, the entire contents of which is incorporated herein by reference.

FIELD OF THIS INVENTION

This invention relates to an integrated circuit.

BACKGROUND OF THE INVENTION

In the prior art, it is known to use bond wires to connect components in an integrated circuit. Bond wires may be inexpensive and may also account for thermal expansion for reliability. However, some bond wires may have large inductances due to their long and thin structures. This poses a challenge when transmitting high frequency signals in the integrated circuit, since large inductance may lead to poor power transfer.

In U.S. Pat. No. 4,686,492 ('Grellmann'), multiple parallel layers of bond wires 101 are connected between different transmission lines 103, 105 in an integrated circuit 100; see FIG. 1. Such an arrangement of the bond wires 101 produces a capacitive effect to compensate for the inductive nature of bond wires. However, a problem with this arrangement of the bond wires 101 is the complexity in fabricating the multiple parallel layers of the bond wires 101, where the gaps between the adjacent bond wires 101 have to be strictly controlled.

SUMMARY OF THE INVENTION

A first aspect of the invention is defined in claim 1. By providing the conductive ribbon having the main portion which continuously increases in width, a desired characteristic impedance of the conductive ribbon may match the characteristic impedance of both the die and the substrate. Advantageously an impedance matching structure may be provided for the integrated circuit, to maximise power transfer of high frequency signals across the integrated circuit.

A second aspect of the invention is defined in claim 2. By providing the ground plane having the first aperture immediately adjacent to the conductive ribbon, a desired characteristic impedance of the conductive ribbon may match the characteristic impedance of both the die and the substrate. Advantageously an impedance matching structure may be provided for the integrated circuit, to maximise power transfer of high frequency signals across the integrated circuit.

Other features of the invention are optional. For example, the first transmission line may be a co-planar waveguide that includes a conductive strip and a ground plane, and the ground plane having a portion that is coplanar with and spaced from the conductive strip. The die may then be arranged on the ground plane, and the second transmission line may be a microstrip line.

Optionally, the second transmission line may also be a co-planar waveguide like the first transmission line. There may be a plurality of conductive ribbons, each to electrically couple the first and the second termination of the respective co-planar waveguide. The width of the each of the plurality of conductive ribbons may continuously decrease from the first termination to the second termination. Consequently, the plurality of conductive ribbons may be configured as a gradual impedance transformer in integrated circuits where the first termination has a lower characteristic impedance compared with the second termination. This is because for each of the plurality of conductive ribbons, the characteristic impedance of the conductive ribbon at the end that is electrically coupled to the first termination matches the lower characteristic impedance of the first termination while the characteristic impedance of the conductive ribbon at the end that is electrically coupled to the second termination matches the higher characteristic impedance of the second termination.

BRIEF DESCRIPTION OF THE FIGURES

Example embodiments will now be described, by way of example only, with reference to the figures of which.

DETAILED DESCRIPTION

Example embodiments may be used in a high frequency integrated circuit. The transmission lines in the high frequency integrated circuit may include a microstrip line assembly and/or a coplanar waveguide. The microstrip line assembly has three layers: a microstrip line, a dielectric substrate layer (which may be a semiconductor die), a ground plane. The co-planar waveguide has two layers: a conductive strip spaced from a coplanar ground plane, and a substrate. A grounded co-planar waveguide has an additional ground plane beneath the substrate.

Several example embodiments will now be described including:
 a) a first embodiment to couple a microstrip line assembly to a stepwise co-planar waveguide via a conductive ribbon having a varying width, where both transmission lines have the same impedance,
 b) a second embodiment to couple a co-planar waveguide to a stepwise co-planar waveguide via conductive ribbons each having a varying width, where both transmission lines have different impedances,
 c) a third embodiment to couple a microstrip line assembly to a stepwise co-planar waveguide via a conductive ribbon having a uniform width, the conductive ribbon is embedded in a mold resin material, the reference ground plane has been appropriately cut out to adjust the characteristic impedance of the ribbon, where both transmission lines have the same impedance, and
 d) a fourth embodiment to couple a co-planar waveguide to a stepwise co-planar waveguide via conductive ribbons each having a uniform width, the conductive ribbons are embedded in a mold resin material, the reference ground plane has been appropriately cut out to adjust the characteristic impedance of the ribbon, where both transmission lines have the same impedance.

Figure 1:
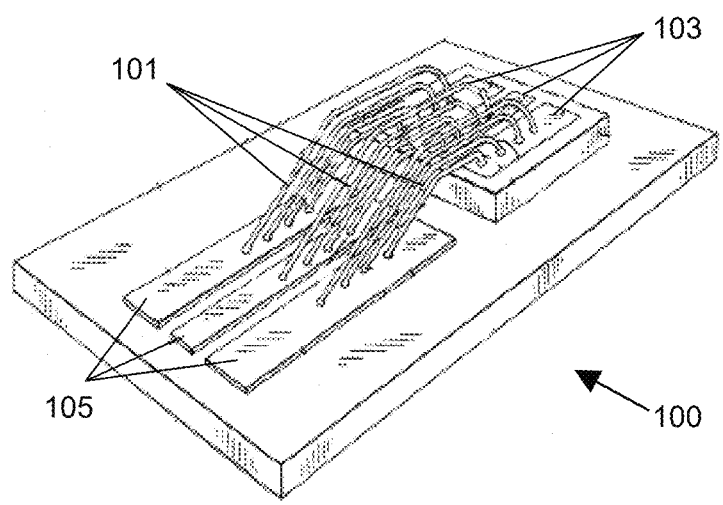
FIG. 1 illustrates a known integrated circuit.
Figure 2:
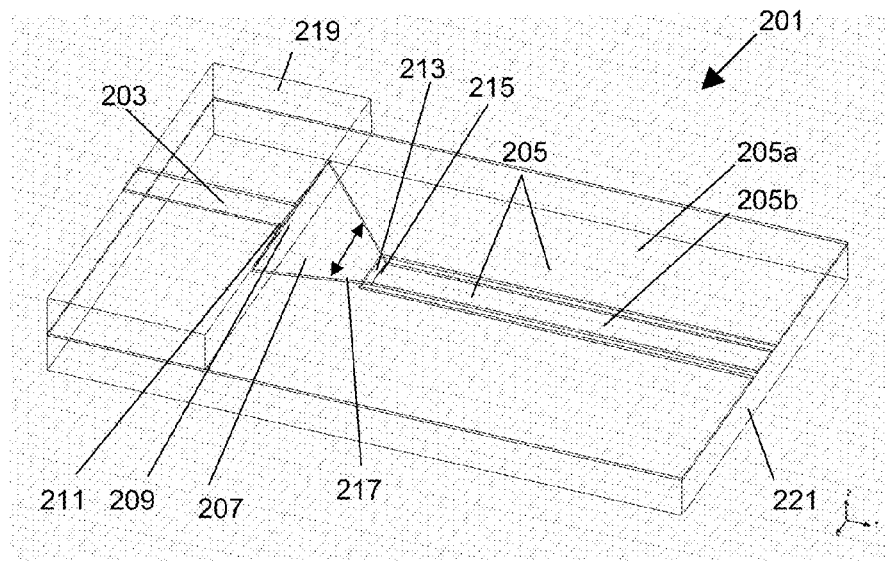
FIG. 2 is a perspective view of a first integrated circuit having a conductive ribbon with a varying width.

A) Microstrip Line Assembly Coupled to a Step-Wise Co-Planar Waveguide, Via a Conductive Ribbon Having a Varying Width FIG. 2 illustrates a first integrated circuit 201 having: i) a substrate (i.e. a printed circuit board ('PCB') 221); ii) a first transmission line (shown as a co-planar waveguide 205, including a ground plane 205a and a co-planar conducting strip 205b) arranged on the PCB 221; iii) an IC die 219 arranged on the PCB 221; iv) a second transmission line (shown as a microstrip line assembly including a microstrip line 203); and v) a conductive ribbon 207.

Specifically, the IC die 219 is arranged on the ground plane 205a of the co-planar waveguide 205. The co-planar waveguide 205 includes a first termination 215 at the co-planar conducting strip 205b, while the microstrip line assembly includes a second termination 211 at the microstrip line 203. The IC die 219 is spaced from the first termination 215 at the co-planar conducting strip 205b, and the microstrip line 203 is arranged on a surface of the IC die 219 opposed to the surface on which the IC die 219 is arranged on the ground plane 205a and indirectly on PCB 221.

The conductive ribbon 207 comprises a first end 213 to electrically connect the first termination 215 at the co-planar conductive strip 205 and a second end 209 to electrically connect the second termination 211 at the microstrip line 203. Because of the relative arrangement of the co-planar conductive strip 205b and the microstrip line 203, they are arranged at different planes in the first integrated circuit 201. Accordingly, the first and the second termination 215, 211 define a step-wise arrangement.

The characteristic impedance of a transmission line is calculated by the following equation: $Z_0 = \sqrt{L/C}$, where $Z_0$ is the characteristic impedance of the transmission line; L is an inductance of unit length of the transmission line and C is a capacitance of unit length of the transmission line. It is found that the characteristic impedance of a conductive ribbon is additionally related to a width of the conductive ribbon, as follows:

$$\frac{W}{H} = \begin{cases} \dfrac{8e^A}{e^{2A}-2}, & \text{for } \dfrac{W}{H} < 2 \\ \dfrac{2}{\pi}\left[B - 1 - \ln(2B-1) + \dfrac{\varepsilon_r - 1}{2\varepsilon_r}\left\{\ln(B-1) + 0.39 - \dfrac{0.61}{\varepsilon_r}\right\}\right], & \text{for } \dfrac{W}{H} > 2 \end{cases} \quad (1)$$

where: W defines the width of the conductive ribbon; H defines a distance between the conductive ribbon and a reference ground plane;

$$A = \frac{Z_0}{60}\sqrt{\frac{\varepsilon_r + 1}{2}} + \frac{\varepsilon_r - 1}{\varepsilon_r + 1}\left(0.23 + \frac{0.11}{\varepsilon_r}\right); B = \frac{377\pi}{2Z_0\sqrt{\varepsilon_r}},$$

in which $B = \dfrac{377\pi}{2Z_0\sqrt{\varepsilon_r} \square z_0}$ is a desired characteristic impedance of the conductive ribbon; and $\in_r$ is the relative dielectric constant of a substrate (which, in the case of the first integrated circuit 201 shown in FIG. 2, is air).

Referring to the first integrated circuit 201 shown in FIG. 2, both the microstrip line 203 and the co-planar waveguide 205 have a same characteristic impedance of 50Ω. To minimise return and insertion losses of high frequency signals during transmission, a desired characteristic impedance of each unit length of the conductive ribbon 207 should therefore be 50Ω to match the characteristic impedances of both the IC die 219 and the PCB 221.

From Equation 1 above, the ratio W/H should be kept constant so that the desired characteristic impedance of each unit length of the conductive ribbon 207 matches the same characteristic impedance of both the IC die 219 and the PCB 221.

From the relative arrangement of the co-planar conductive strip 205b and the microstrip 203, it is seen that the first and the second termination 215, 211 define a step-wise arrangement. Consequently, the conductive ribbon 207 includes a main portion having a width 217 that continuously increases in width from its first end 213 to the second end 209 as the height of the ribbon over the ground plane gradually increased.

The conductive ribbon 207 may be provided with a transition portion (not shown) to introduce a less abrupt width increase from the second end 203.

Figure 3:
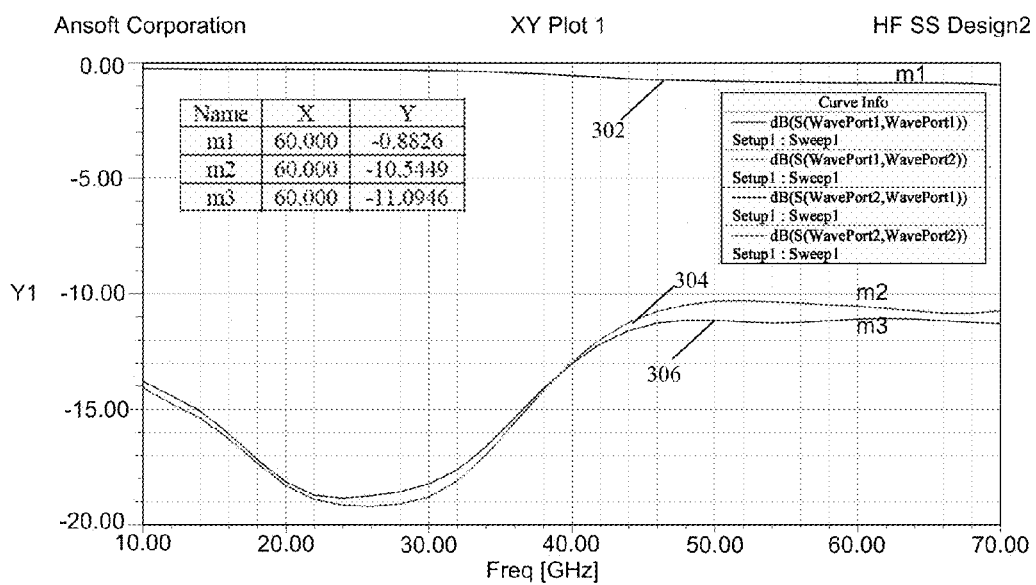
FIG. 3 is a graph of return and insertion losses of the first integrated circuit of FIG. 2.

FIG. 3 shows a simulation result of the first integrated circuit 201 in respect of its return and insertion losses. It is shown that the return loss 304,306 of the first integrated circuit 201 with the conductive ribbon 207 is less than −10 dB over a broad frequency range of between 10 GHz and 70 GHz. Also, the insertion loss 302 over this frequency range is less than 1 dB. Hence, the conductive ribbon 207 provides a wideband impedance matching structure for the first integrated circuit 201.

Figure 4:
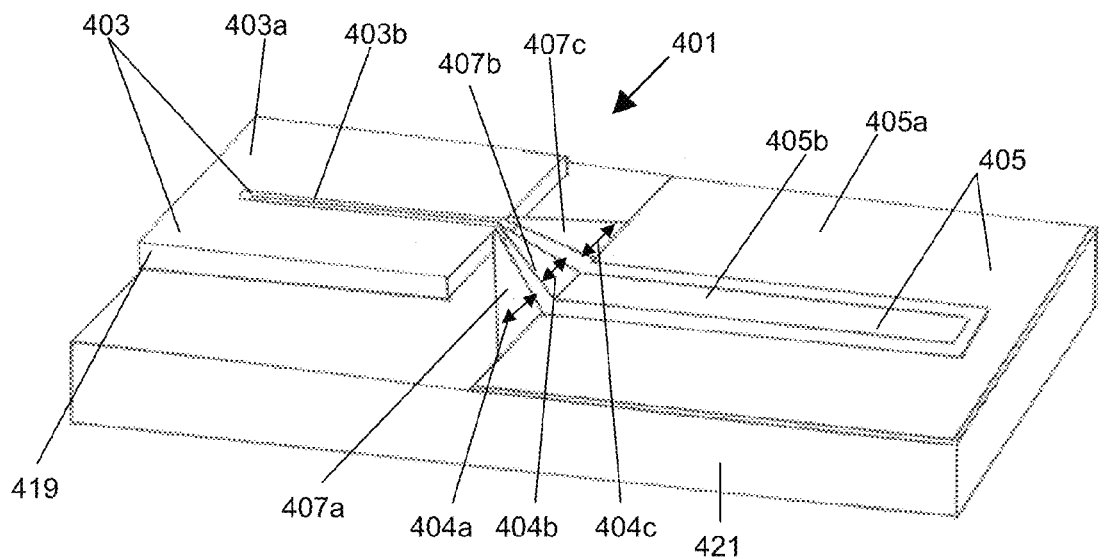
FIG. 4 is a perspective view of a second integrated circuit having three conductive ribbons, each with a varying width.

B) Co-Planar Waveguide Coupled to a Step-Wise Co-Planar Waveguide, Via Conductive Ribbons Each Having a Varying Width FIG. 4 shows a second integrated circuit 401 comprising: i) a substrate (i.e. a PCB 421); ii) a first transmission line (shown as a first co-planar waveguide 405, including a ground plane 405a and a co-planar conducting strip 405b) arranged on the PCB 421; iii) an IC die 419 also arranged on the PCB 421; iv) a second transmission line (shown as a second co-planar waveguide 403, including a ground plane 403a and a co-planar conducting strip 403b) arranged on the PCB 421; and v) three conductive ribbons 407a, 407b, 407c.

Like the first integrated circuit 201, both the first and second co-planar waveguides 405, 403 include respective terminations. The IC die 419 is also spaced from the termination at the first co-planar waveguide 405, and the second co-planar waveguide 403 is arranged on a surface of the IC die 419 opposed to that on which the IC die 419 is arranged on the PCB 421. Moreover, the ends of each of the conductive ribbons 407a, 407b, 407c are electrically coupled between the first and second termination at the respective first and the second co-planar waveguides 405, 403.

Because of the relative arrangement of the co-planar conductive strip 405b and the other co-planar strip 403b, they are at different planes in the second integrated circuit 401. Accordingly, the first and the second termination define a step-wise arrangement.

Unlike the first integrated circuit 201, characteristic impedances of the first and the second co-planar waveguides 405, 403 are different. More specifically, for example, the characteristic impedance of the first co-planar waveguide 405 is 50Ω while the characteristic impedance of the second co-planar waveguide 403 is 300Ω. Accordingly, the conductive ribbons 407a, 407b, 407c are configured as a gradual impedance transformer by requiring the characteristic impedances at the ends of the conductive ribbons 407a, 407b, 407c to match the corresponding characteristic impedances of the respective terminations.

Revisiting the Equation 1 above, each of the conductive ribbons 407a, 407b, 407c should have a varying width 404a, 404b, 404c, such that its desired characteristic impedance between both ends increases from 50Ω (at the end electrically coupled to the first termination) to 300Ω (at the end electrically coupled to the second termination). In this way, the conductive ribbons 407a, 407b, 407c operate as a gradual impedance transformer.

Air is the dielectric material in both the first and the second integrated circuits 201, 401. Since the dielectric constant of air is much smaller than that of other dielectric material (e.g. mold resin material), the widths of the conductive ribbon 209 or the plurality of conductive ribbons 407a, 407b, 407c can be reduced by embedding these conductive ribbons in mold resin material.

Figure 5:
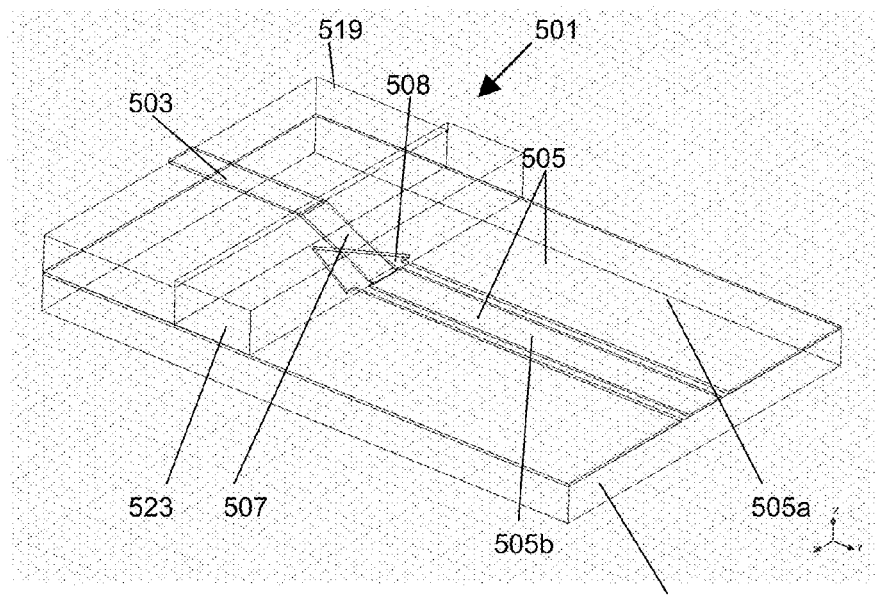
FIG. 5 is a perspective view of a third integrated circuit having a ground plane with a cut-out portion.

C) Microstrip Line Assembly Coupled to a Step-Wise Co-Planar Waveguide, Via a Conductive Ribbon Having a Uniform Width FIG. 5 illustrates a third integrated circuit 501 comprising: i) a substrate (i.e. a PCB 521); ii) a first transmission line (shown as a first co-planar waveguide 505, including a ground plane 505a and a co-planar conducting strip 505b) arranged on the PCB 521; iii) an IC die 519 arranged on the PCB 521; iv) a second transmission line (shown as a microstrip line assembly, including a microstrip line 503 arranged on the IC die 519; and v) a conductive ribbon 507.

Like the first integrated circuit 201, the co-planar conducting strip 505b and the microstrip line 503 include a respective first and second termination. The IC die 519 is also spaced from the first termination at the co-planar conducting strip 505b, and the microstrip line 503 is arranged on a surface of the IC die 519 opposed to the surface on which the IC die 519 is arranged on the ground plane 505a and indirectly on the PCB 521. Also, the conductive ribbon 507 electrically couples the first and the second termination.

Because of the relative arrangement of the co-planar conductive strip 505b and the microstrip line 503, they are arranged at different planes in the third integrated circuit 501. Accordingly, the first and the second termination define a step-wise arrangement.

Moreover, and like the first integrated circuit 201, characteristic impedances of the first and the second co-planar waveguides 405, 403 are the same. More specifically, both the characteristic impedances of the co-planar waveguide 505 and the microstrip line assembly are 50Ω. A desired characteristic impedance of each unit length of the conductive ribbon 507 should therefore be 50Ω to match the same characteristic impedances of both the co-planar waveguide 505 and the microstrip line assembly.

However, and unlike the conductive ribbon 207 of the first integrated circuit 201 (or the conductive ribbons 407a, 407b, 407c of the second integrated circuit 401), the conductive ribbon 507 has a constant width along its length. To ensure that a desired characteristic impedance of the conductive ribbon 507 matches the same characteristic impedance of both the co-planar waveguide 505 and the microstrip line assembly, an aperture (shown as a cavity 508 in FIG. 5) is provided by removing portion of the ground plane 505a beneath to the conductive ribbon 507.

The cavity 508 in the ground plane 505a is provided by removing a portion of the ground plane 505a. Specifically, the width of the cavity 508 is varied continuously according to its distance to the conductive ribbon 507. More specifically, the area of the cavity 508 decreased from the first termination (at the co-planar waveguide) to the second termination (at the microstrip line 503). This ensures that the desired characteristic impedance of the conductive ribbon 507 matches the same characteristic impedance of both the co-planar waveguide 505 and the microstrip line assembly. Moreover, fabrication of integrated circuits with conductive ribbons of a fixed width may be easier, compared with fabrication of integrated circuits with conductive ribbons of a varying width.

Further, it is seen that a mold resin material 523 is used to embed the conductive ribbon 507, so that a smaller width of the conductive ribbon 507 may be used compared with a corresponding conductive ribbon of an integrated circuit in which air is used instead.

Figure 6:
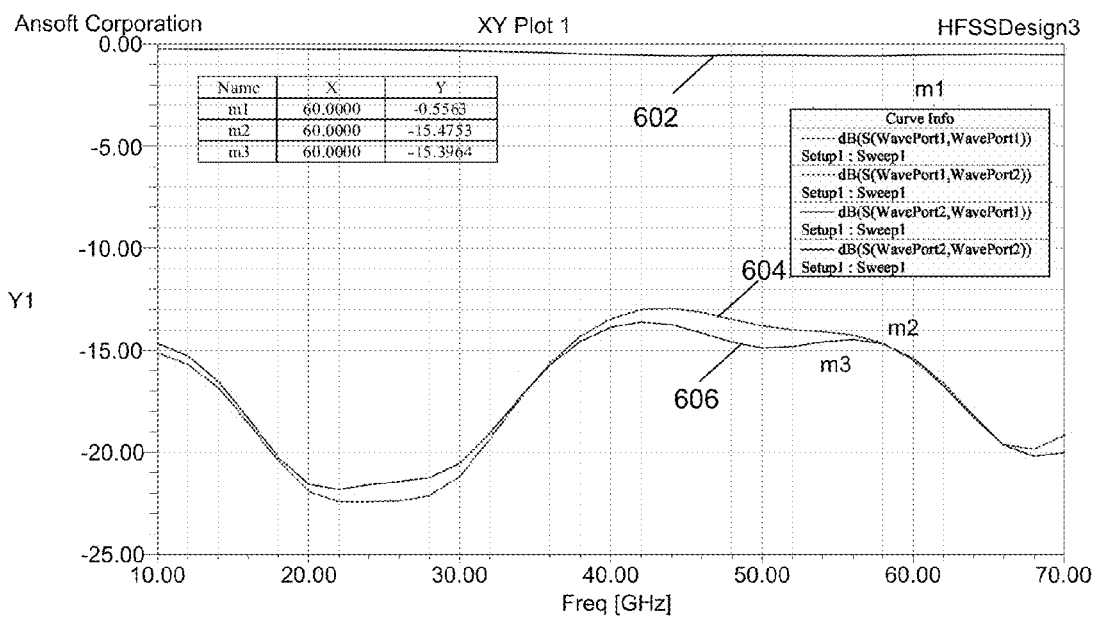
FIG. 6 is a graph of return and insertion losses of the third integrated circuit of FIG. 5.

FIG. 6 shows a simulation result of the third integrated circuit 501 in respect of its return and insertion losses. It is shown that the return loss 604,606 of the third integrated circuit 501 is less than −10 dB over a broad frequency range of between 10 GHz and 70 GHz. Also, the insertion loss 602 over this frequency range is less than 1 dB. Hence, the cavity 508 of the ground plane 505a and the ribbon 507 provides a wideband impedance matching structure for the third integrated circuit 501.

Figure 7:
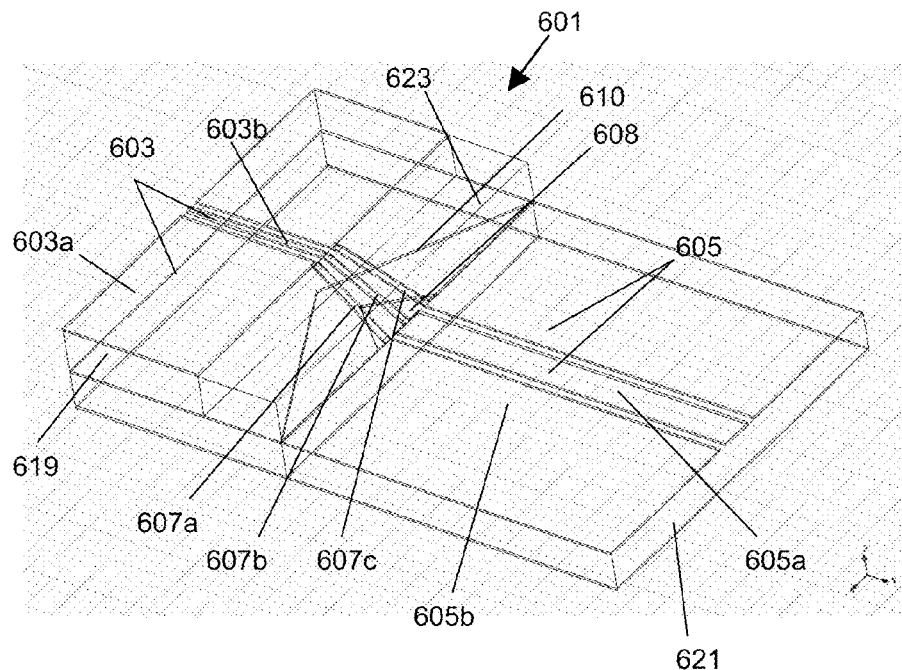
FIG. 7 is a perspective view of a fourth integrated circuit having a ground plane with a cut-out portion.

D) Co-Planar Waveguide Coupled to a Co-Planar Waveguide, Via Conductive Ribbons Each Having a Uniform Width FIG. 7 illustrates a fourth integrated circuit 601 comprising: i) a substrate (i.e. PCB 621); ii) a first transmission line (shown as a first co-planar waveguide 605, including a first ground plane 605a and a first co-planar conducting strip 605b) arranged on the PCB 621; iii) an IC die 619 arranged on the PCB 621; iv) a second transmission line (shown as a second co-planar waveguide 603, including a second ground plane 603a and a second co-planar conducting strip 603b); and v) three conductive ribbons 607a, 607b, 607c.

Like the third integrated circuit 501, a portion of the first ground plane 605a is cut out to provide an aperture (shown as cavity 608) in the first ground plane 605a for adjusting the capacitance of the ribbon trace 607b relative to ground, and hence, the characteristic impedance of the conductive ribbons 607a, 607b, 607c. As shown in FIG. 7, the cavity 608 is defined as a double-triangular—i.e. the inner (smaller) triangle and the outer (bigger) triangle, the ground plane inside the inner triangle and outside of the bigger triangle is removed to form the cavity 608. It is used to adjust the capacitance of the signal trace 607b relative to the ground plane.

Like the conductive ribbon 507 of the third integrated circuit 501, the width of the conductive ribbons 607a, 607b, 607c is uniform. This advantageously simplifies fabrication of the integrated circuits. However, whereas the second transmission line 503 of the third integrated circuit 501 defines a microstrip line assembly, the second transmission line 603 of the fourth integrated circuit 601 defines a co-planar waveguide. Thus, the fourth integrated circuit 601 may be more advantageous then the third integrated circuit 501 since the width of the conductive ribbons 607a, 607b, 607c can be made smaller than that of the third integrated circuit 501. To reduce the width of the conductive ribbons 607a, 607b, 607c yet further, a mold resin material 623 is used to embed (or encapsulate) the conductive ribbons 607a, 607b, 607c, as shown in FIG. 7. For example, between corresponding example configurations of these integrated circuits, the width of the conductive ribbon 507 of the third integrated circuit 501 may be about 220 microns whereas the width of the conductive ribbons 607a, 607b, 607c of the fourth integrated circuit 601 may only be about 50 microns.

Figure 8:
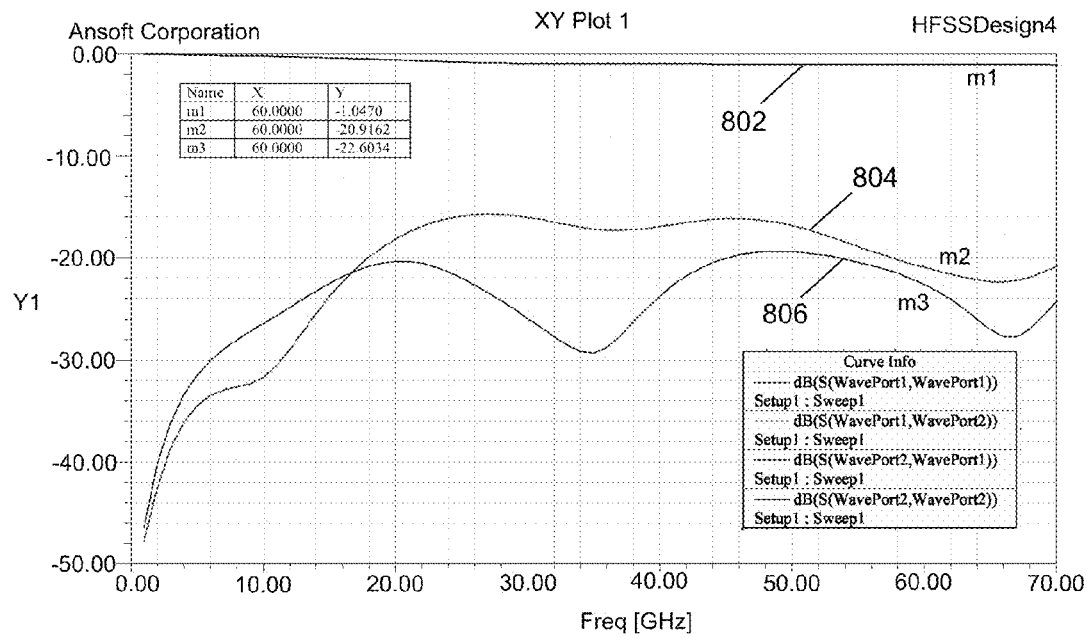
FIG. 8 is a graph of return and insertion losses of the fourth integrated circuit of FIG. 7.

FIG. 8 shows a simulation result of the fourth integrated circuit 601 in respect of its return and insertion losses. It is shown that its return loss 804,806 is less than −10 dB over a broad frequency range of between 0 GHz and 70 GHz. Also, the insertion loss 802 over this frequency range is less than 1 dB. Hence, the cavity 608 of the ground plane 605a provides a wideband impedance matching structure for the fourth integrated circuit 601.

Wideband impedance matching structures for integrated circuits have thus been proposed. Such wideband impedance matching structures will maximise power transfer of high frequency signals across the different integrated circuits 201, 401, 501, 601. Further, by providing a wideband impedance matching structure through configuring a cavity in the ground plane of a co-planar waveguide, the width of a conductive ribbon can be advantageously fixed along its length, which thereby simplifying fabrication of integrated circuits. Also, by embedding the ribbon into mold resin material, the width of the ribbon can also be reduced.

Although the invention has been described with reference only to a few embodiments, many variations are however possible within the scope of the claims, as will be clear to a skilled reader, without departing from the invention as claimed. For example, a variety of the geometrical structures (or dimensions) of the conductive ribbons 207, 407a, 407b, 407c are possible to provide wideband impedance matching structures for integrated circuits. Also, a variety of configurations of the cavity 508, 608 in the ground plane 505a, 605a are possible to provide wideband impedance matching structures for integrated circuits. Moreover, the conductive ribbons 207, 407a, 407b, 407c, 507, 607a, 607b, 607c may be build-in within a flexible substrate (e.g. a flexible PCB) to simplify fabrication of the integrated circuits 201, 401, 501, 601 in respect of the dimensions of these conductive ribbons and/or a gap distance between the adjacent conductive ribbons. The flexible PCB may also be easily soldered to an IC die or a PCB. Further, it should be appreciated that the described embodiments are equally applicable to integrated circuits where the IC dies 219, 419, 519, 619 are respective sources and the PCBs 221, 421, 521, 621 respective loads as well as to integrated circuits where the IC dies 219, 419, 519, 619 are respective loads and the PCBs 221, 421, 521, 621 respective sources. Simply put, high frequency signals may be transmitted in either directions in the integrated circuits 201, 401, 501, 601 between the IC dies 219, 419, 519, 619 and the PCBs 221, 421, 521, 621. Also, the integrated circuits 201, 401, 501, 601 may operate at a frequency within a certain range of the microwave spectrum such as between 10 GHz and 70 GHz, or between 30 GHz and 50 GHz, or even higher frequency. Although PCBs have been used as the substrates for the described integrated circuits, other suitable substrates may also be used. Additionally, the PCB 221, 421, 521, 621 may each have a thickness of 200 microns, 300 microns, or 400 microns. Further, superglue may be used in place of the mold resin material mentioned above for encapsulating the conductive ribbons. For example, if the superglue with a dielectric constant of 7 were used, the uniform width of the conductive ribbons 607a, 607b, 607c of the fourth integrated circuit 601 may be reduced to 50 microns.

Furthermore, the application of the proposed structures is not limited to IC connection. For example, it may be used to connect any 2D planar structure (e.g. co-planar waveguide) to another 2D planar structure of different height.

The invention claimed is:

1. An integrated circuit comprising:
a substrate;
a first transmission line on the substrate, the first transmission line having a first end;
a die having a first surface on the substrate and a second surface facing away from the first surface, the die being spaced from the first end;
a second transmission line on the second surface of the die, the second transmission line having a second end; and
a conductive ribbon electrically coupling the first end and the second end, the conductive ribbon including a main portion which continuously increases in width,
wherein,
the main portion varies in width as a height of the conductive ribbon varies from a surface of the substrate.

2. The integrated circuit of claim 1, further comprising an encapsulant around the conductive ribbon.

3. The integrated circuit of claim 2, wherein the encapsulant is resin.

4. The integrated circuit of claim 1, wherein the main portion varies in width as a height of the conductive ribbon over a ground plane increases.

5. The integrated circuit of claim 1, wherein the conductive ribbon includes a transition portion which continuously increases in width from the second end.

6. The integrated circuit of claim 1, wherein the integrated circuit is operable at a frequency of between 10 GHz and 70 GHz.

7. A conductive ribbon for use in an integrated circuit according to claim 1.

8. The integrated circuit of claim 1, wherein the main portion of the conductive ribbon satisfies a relationship in which $$\frac{W}{H} = \begin{cases} \frac{8e^A}{e^{2A}-2}, & \text{for } \frac{W}{H} < 2 \\ \frac{2}{\pi}\left[B - 1 - \ln(2B-1) + \frac{\varepsilon_r - 1}{2\varepsilon_r}\left\{\ln(B-1) + 0.39 - \frac{0.61}{\varepsilon_r}\right\}\right], \\ \text{for } \frac{W}{H} > 2 \end{cases}$$

where,
W is a width of the conductive ribbon;
H is a distance between the conductive ribbon and a reference ground plane;
$Z_0$ is a characteristic impedance of the conductive ribbon;
$\varepsilon_r$ is a relative dielectric constant of air;

$$A = \frac{z_0}{60}\sqrt{\frac{\varepsilon_r + 1}{2}} + \frac{\varepsilon_r - 1}{\varepsilon_r + 1}\left(0.23 + \frac{0.11}{\varepsilon_r}\right); \text{ and}$$

$$B = \frac{377\pi}{2z_0\sqrt{\varepsilon_r}}.$$

9. An integrated circuit comprising:
a substrate;
a first transmission line on the substrate, the first transmission line having a first end;
a die having a first surface on the substrate and a second surface facing away from the first surface, the die being spaced from the first end;
a second transmission line on the second surface of the die, the second transmission line having a second end; and
a conductive ribbon electrically coupling the first end and the second end, the conductive ribbon including a main portion which continuously increases in width,
wherein,
the first transmission line is a first co-planar waveguide including a first conductive strip and a first ground plane, the first ground plane having a portion coplanar with and spaced from the first conductive strip.

10. The integrated circuit of claim 9, wherein the second transmission line is a microstrip line.

11. The integrated circuit of claim 9, wherein the second transmission line is a second co-planar waveguide including a second conductive strip and a second ground plane, the second ground plane having a portion coplanar with and spaced from the second conductive strip.

12. The integrated circuit of claim 11, further comprising a third ground plane including a third portion coplanar with and spaced from the conductive ribbon.

13. The integrated circuit of claim 12, wherein the width of the conductive ribbon continuously decreases from the first end to the second end.

* * * * *